United States Patent
Brock et al.

(10) Patent No.: US 6,730,452 B2
(45) Date of Patent: *May 4, 2004

(54) LITHOGRAPHIC PHOTORESIST COMPOSITION AND PROCESS FOR ITS USE

(75) Inventors: Phillip Joe Brock, Sunnyvale, CA (US); Daniel Joseph Dawson, San Jose, CA (US); Hiroshi Ito, San Jose, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/771,261

(22) Filed: Jan. 26, 2001

(65) Prior Publication Data

US 2002/0146639 A1 Oct. 10, 2002

(51) Int. Cl.$^7$ ............... G03F 7/039; C08F 20/22

(52) U.S. Cl. ............. 430/270.1; 430/323; 430/326; 430/907; 526/245; 526/248

(58) Field of Search .............. 430/270.1, 907, 430/326, 323; 526/245, 248

(56) References Cited

U.S. PATENT DOCUMENTS

| | | | | |
|---|---|---|---|---|
| 3,544,535 A | * | 12/1970 | Gilbert et al. | 442/82 |
| 4,268,607 A | * | 5/1981 | Tada | 430/270.1 |
| 4,983,495 A | * | 1/1991 | Tsutsumi et al. | 430/270.1 |
| 5,192,643 A | * | 3/1993 | Kotachi et al. | 430/270.1 |
| 5,958,648 A | * | 9/1999 | Nishimura et al. | 430/270.1 |
| 6,087,064 A | | 7/2000 | Lin et al. | 430/270.1 |
| 6,110,640 A | * | 8/2000 | Kawamura et al. | 430/270.1 |
| 6,280,905 B1 | * | 8/2001 | Koshimura et al. | 430/281.1 |
| 6,509,134 B2 | * | 1/2003 | Ito et al. | 430/270.1 |
| 2001/0010890 A1 | | 8/2001 | Hatakeyama et al. | |
| 2001/0018162 A1 | | 8/2001 | Hatakeyama et al. | |
| 2001/0038969 A1 | | 11/2001 | Hatakeyama et al. | |

OTHER PUBLICATIONS

Allen (1997), "Progress in 193 nm Photoresists," *Semiconductor International*, pp. 72–79.

Crawford et al. (2000), "New Materials for 157 nm Photoresists: Characterization and Properties," *Advances in Resist Technology and Processing XVII, Proceedings of SPIE* 3999:357–364.

Ito et al. (1984), "Radical Reactivity and Q–e Values of Methyl α–(Trifluoromethyl)Acrylate," *Macromolecules* 17(10):2204–2205.

Kunz et al. (1999), "Outlook for 157–nm Resist Design," *Part of the SPIE Conference on Advances in Resist Technology and Processing XVI, SPIE 3678*:13–23.

Matsuzawa et al. (2000), "Theoretical Calculations of Photoabsorption of Molecules in the Vacuum Ultraviolet Region", *Advances in Resist Technology and Processing XVII, Proceedings of SPIE 3999*:375–384.

Patterson et al. (2000), "Polymers for 157 nm Photoresist Applications: A Progress Report," *Advances in Resist Technology and Processing XVII, Proceedings of SPIE 3999*:365–374.

Pryzbilla et al. (1992), "Hexafluoroacetone in Resist Chemistry: A Versatile New Concept for Materials for Deep UV Lithography," *Advances in Resist Technology and Processing IX, SPIE 1672*:500–512.

Schmalijohann et al. (2000), "Design Strategies for 157 nm Single–Layer Photoresists: Lithographic Evaluation of a Poly(α–Trifluoromethyl Vinyl Alcohol) Copolymer," *Advances in Resist Technology and Processing XVII, Proceedings of SPIE 3999*:330–334.

Abe et al. (1995), "Study of ArF Resist Material in Terms of Transparency and Dry Etch Resistance," *Journal of Photopolymer Science and Technology* 8(4):637–642.

Allen et al. (1995), "Resolution and Etch Resistance of a Family of 193 nm Positive Resists," *Journal of Photopolymer Science and Technology* 8(4):623–636.

Endert et al. (1999), "Microstructuring with 157 nm Laser Light," *SPIE 3618*:413–417, Part of the SPIE Conference on Laser Applications in Microelectronic and Optoelectronic Manufacturing IV.

Kunz et al. (1999), "Outlook for 157–nm Resist Design," *SPIE 3678*:13–23, Part of the SPIE Conference on Advancees in Resist Technology and Processing XVI.

Onishi et al. (1991), "Acid Catalyzed Resist for KrF Excimer Laser Lithography," *Journal of Photopolymer Science and Technology* 4(3):337–340.

Robin (1974), *Higher Excited States of Polyatomic Molecules*, vol. 1, pp. 254–265.

Sandorfy et al. (1985), "Valence–Shell and Rydberg Transitions in Large Molecules," *Photophysics and Photochemistry in the Vacuum Ultraviolet*, pp. 819–840.

(List continued on next page.)

*Primary Examiner*—John S. Chu
(74) *Attorney, Agent, or Firm*—Reed & Eberle LLP

(57) ABSTRACT

A lithographic photoresist composition is provided that can be used as a chemical amplification photoresist. In a preferred embodiment, the composition is substantially transparent to deep ultraviolet radiation, i.e., radiation of a wavelength less than 250 nm, including 157 nm, 193 nm and 248 nm radiation, and has improved sensitivity and resolution. The composition comprises a fluorinated vinylic polymer, particularly a fluorinated methacrylate, a fluorinated methacrylonitrile, or a fluorinated methacrylic acid, and a photoacid generator. The polymer may be a homopolymer or a copolymer. A process for using the composition to generate resist images on a substrate is also provided, i.e., in the manufacture of integrated circuits or the like.

60 Claims, No Drawings

OTHER PUBLICATIONS

Chiba et al. (2000), "157 nm Resist Materials: A Progress Report," *Journal of Photopolymer Science and Technology* 13(4):657–664.

Ito et al. (1981), "Methyl Alpha–Trifluoromethylacrylate, an E–Beam and UV Resist," *IBM Technical Disclosure Bulletin* 24(2):991.

Ito et al. (1982), "Polymerization of Methyl α–(Trifluoromethyl)Acrylate and α–(Trifluoromethyl)Acrylonitrile and Copolymerization of These Monomers with Methyl Methacrylate," *Macromolecules* 15:915–920.

Ito et al. (1987), "Anionic Polymerization of α–(Trifluoromethyl)Acrylate," *Recent Advances in Anionic Polymerization*, T.E. Hogen–Esch and J. Smid, Editors, Elsevier Science Publishing Co., Inc., pp. 412–430.

Ito et al. (1998), "Synthesis and Evaluation of Alicyclic Backbone Polymers for 193 nm Lithography," *ACS Symposium Series 706, Micro–and Nanopatterning Polymers*, pp. 208–223.

Willson et al. (1983), "Poly(Methyl α–Trifluoromethylacrylate) as a Positive Electron Beam Resist," *Polymer Engineering and Science* 23(18):1000–1003.

* cited by examiner

LITHOGRAPHIC PHOTORESIST COMPOSITION AND PROCESS FOR ITS USE

TECHNICAL FIELD

This invention relates generally to the fields of lithography and semiconductor fabrication. More particularly, the invention relates to the use of certain fluorinated polymers useful in chemical amplification photoresist compositions, including ultraviolet, electron-beam, and x-ray photoresists.

BACKGROUND

There is a desire in the industry for higher circuit density in microelectronic devices made using lithographic techniques. One method of increasing the number of components per chip is to decrease the minimum feature size on the chip, which requires higher lithographic resolution. This has been accomplished over the past twenty years by reducing the wavelength of the imaging radiation from the visible (436 nm) down through the ultraviolet (365 nm) to the deep ultraviolet (DUV) at 248 nm. Development of commercial lithographic processes using ultra-deep ultraviolet radiation, particularly 193 nm, is now becoming of interest. See, for example, Allen et al. (1995), "Resolution and Etch Resistance of a Family of 193 nm Positive Resists," *J. Photopolym. Sci. and Tech.* 8(4):623–636, and Abe et al. (1995), "Study of ArF Resist Material in Terms of Transparency and Dry Etch Resistance," *J Photopolym. Sci. and Tech.* 8(4): 637–642. The resists proposed for use with 193 nm imaging radiation do not appear suitable for use with 157 nm radiation due to their poor transparency at the 157 nm wavelength.

Certain attempts have been made to develop 157 nm resists, for example using heavily fluorinated materials such as polytetrafluoroethylene (e.g., Teflon AF®; see Endert et al. (1999) Proc. SPIE-Int. Soc. Opt. Eng,3618:413–417) or hydridosilsesquioxanes (see U.S. Pat. No. 6,087,064 to Lin et al.). These materials do not, however, have the requisite reactivity or solubility characteristics. The challenge in developing chemically amplified resists for 157 nm lithography is in achieving suitable transparency in polymers that have acid-labile functionalities and developed with industry standard developers in either exposed or unexposed areas depending on whether the resist is positive or negative.

Polymers prepared from trifluoromethyl-substituted acrylates have been described. See, for example, Ito et al. (1981), "Methyl Alpha-Trifluoromethylacrylate, an E-Beam and UV Resist," IBM Technical Disclosure Bulletin 24(4):991, Ito et al. (1982) *Macromolecules* 15:915–920, which describes preparation of poly(methyl α-trifluoromethylacrylate) and poly(α-trifluoromethylacrylonitrile) from their respective monomers, and Ito et al. (1987), "Anionic Polymerization of α-(Trifluoromethyl)Acrylate," in *Recent Advances in Anionic Polymerization,* T. E. Hogen-Esch and J. Smid, Eds. (Elsevier Science Publishing Co., Inc.), which describes an anionic polymerization method for preparing polymers of trifluoromethylacrylate. Willson et al., *Polymer Engineering and Science* 23(18):1000–1003, also discuss poly(methyl α-trifluoromethylacrylate) and use thereof in a positive electron beam resist. However, none of these references discloses the utility of trifluoromethyl-substituted acrylate polymers in chemical amplification resists.

SUMMARY OF THE INVENTION

Accordingly, it is a primary object of the invention to address the above-described need in the art by providing a novel lithographic photoresist composition containing a fluorinated vinylic polymer.

It is another object of the invention to provide such a composition wherein the fluorinated vinylic polymer is substantially transparent to deep ultraviolet radiation, i.e., radiation having a wavelength less than 250 nm.

It is yet another object of the invention to provide such a composition wherein the fluorinated vinylic polymer is a fluorinated methacrylate, a fluorinated methacrylic acid, or a fluorinated methacrylonitrile.

It is still another object of the invention to provide a method for generating a resist image on a substrate using a photoresist composition as described herein.

It is a further object of the invention to provide a method for forming a patterned structure on a substrate by transferring the aforementioned resist image to the underlying substrate material, e.g., by etching.

Additional objects, advantages and novel features of the invention will be set forth in part in the description which follows, and in part will become apparent to those skilled in the art upon examination of the following, or may be learned by practice of the invention.

The inventors have now discovered that certain fluorinated polymers, particularly fluorinated acrylate polymers, exhibit surprisingly good transparency at 157 nm. The finding that an acrylate polymer can serve as a suitable 157 nm resist material in a chemically amplified resist is quite unexpected in view of the fact that the acrylate's carbonyl functionality is highly absorbent at this wavelength. While incorporation of fluorine into polymers is known to lower absorbance at short wavelengths in at least some cases, it was anticipated that the relatively low fluorine content in polymers formed from methyl trifluoromethylacrylate (MTFMA), coupled with the fact that the trifluoromethyl group is insulated from the carbonyl moiety, would be insufficient to offset the very intense absorbance of the carbonyl group at 157 nm. Surprisingly, however, the incorporation of a trifluoromethyl group has turned out to substantially lower the absorbance of the carbonyl group at 157 nm. Therefore, polymers prepared from trifluoromethyl-substituted acrylates and derivatives thereof can be used to formulate chemical amplification resists useful in 157 nm lithography.

In one embodiment, then the present invention relates to a novel lithographic photoresist composition comprising a fluorinated vinylic polymer and a photosensitive acid generator (also referred to herein as a "photoacid generator," a "PAG," or a "radiation-sensitive acid generator"). The fluorinated vinylic polymer is preferably a fluorinated methacrylate, a fluorinated methacrylic acid, or a fluorinated methacrylonitrile. The fluorinated vinylic polymer preferably contains monomeric units having the structure (I)

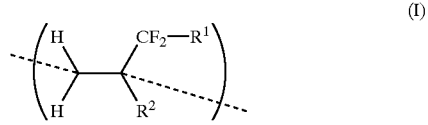

wherein $R^1$ is fluoro, methyl or trifluoromethyl, preferably fluoro, and $R^2$ is selected from the group consisting of

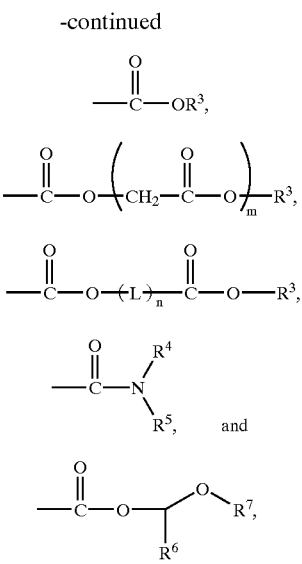

wherein R³ is hydrogen, lower alkyl or fluorinated lower alkyl, or is selected so as to render R² acid-cleavable. R⁴ and R⁵ are lower alkyl or are linked to form a five-or six-membered heterocyclic ring that may or may not contain an additional heteroatom, R⁶ and R⁷ are lower alkyl or are linked to form a five-or six-membered heterocyclic ring that may or may not contain an additional heteroatom and/or a carbonyl moiety, m is an integer in the range of 1 to 3 inclusive, n is zero or 1, and L is a linking group such as an alkylene (typically lower alkylene) chain or a phenylene ring. Preferably, R² has the structure of formula (III), and R³ is selected so as to render R² an acid-cleavable functionality, i.e., a molecular moiety that is cleavable with acid, particularly photogenerated acid. When R² is —(CO)—OR³ (i.e., structure III), it will be appreciated that acid cleavage of the ester generates a free carboxylic acid group. The fluorinated polymer containing the aforementioned monomer unit may be a homopolymer or copolymer; if a copolymer, suitable comonomers will generally be additional polymerizable, ethylenically unsaturated comonomers, preferably vinyl comonomers such as acrylic acid and methacrylic acid derivatives, e.g., acrylates and methacrylates, styrene, substituted styrenes, norbornene, substituted norbornene, etc. In addition, the copolymer may contain two or more monomer units having the structure of formula (I), e.g., monomer units containing acid-cleavable pendant groups (such as —(CO)—OR³ groups wherein R³ renders the ester acid-cleavable), as well as other monomer units that provide for better dissolution, transparency, and/or other desirable properties of the resist composition (e.g., monomer units containing pendant —(CO)—O—(lower alkyl) groups or —(CO)—O—(fluorinated lower alkyl) groups, or the like). The polymer may serve as either the base-soluble component of an unexposed resist or as an acid-labile material (e.g., by virtue of containing acid-cleavable pendant groups such as acid-cleavable esters) that releases acid following irradiation by virtue of the photoacid generator in the resist composition.

The present invention also relates to the use of the resist composition in a lithography method. The process involves the steps of (a) coating a substrate (e.g., a ceramic, metal or semiconductor substrate) with a film comprising a radiation-sensitive acid generator and a fluorinated polymer as provided herein; (b) exposing the film selectively to a predetermined pattern of radiation to form a latent image therein; and (c) developing the image using a suitable developer composition. The radiation may be ultraviolet, electron beam or x-ray. Ultraviolet radiation is preferred, particularly deep ultraviolet radiation having a wavelength of less than about 250 nm, e.g., 157 nm, 193 nm, or 248 nm. The pattern from the resist structure may then be transferred to the underlying substrate. Typically, the transfer is achieved by reactive ion etching or some other etching technique. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

DETAILED DESCRIPTION OF THE INVENTION

Overview and Definitions

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, reference to "a monomer" includes a combination of two or more monomers that may or may not be the same, a "photoacid generator" includes a mixture of two or more photoacid generators, and the like.

In describing and claiming the present invention, the following terminology will be used in accordance with the definitions set out below.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of 1 to 6 carbon atoms, and the term "lower alkyl ester" refers to an ester functionality —C(O)O—R wherein R is lower alkyl.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkoxy (preferably lower alkoxy), and the like. Unless otherwise indicated, the term "aryl" is also intended to include heteroaromatic moieties, i.e., aromatic heterocycles. Generally, although not necessarily, the heteroatoms will be nitrogen, oxygen or sulfur.

The term "fluorinated" refers to a compound in which one or more hydrogen atoms have been replaced by a fluorine atom. The term encompasses "perfluorinated" compounds in which all hydrogen atoms of a molecular segment or entire molecule have been replaced by fluorine atoms. Thus, a "fluorinated" methyl group encompasses —CH₂F and —CHF₂ as well as the "perfluorinated" methyl group —CF₃.

The term "polymer" is used to refer to a chemical compound that comprises linked monomers, and that may be linear, branched or crosslinked. The polymer may be a homopolymer or a copolymer.

The terms "photogenerated acid" and "photoacid" are used interchangeably herein to refer to the acid that is created upon exposure of the present compositions to radiation, i.e., as a result of the radiation-sensitive acid generator in the compositions.

The term "substantially transparent" as used to describe a polymer that is "substantially transparent" to radiation of a particular wavelength refers to a polymer that has an absorbance of less than about 5.0/micron, preferably less than about 4.0/micron, most preferably less than about 3.5/micron, at a selected wavelength.

For additional information concerning terms used in the field of lithography and lithographic compositions, reference may be had to *Introduction to Microlithography*, Eds. Thompson et al. (Washington, D.C.: American Chemical Society, 1994).

In one embodiment, then, the present invention relates to lithographic photoresist composition comprising (a) a fluorinated vinylic polymer, and (b) a photoacid generator. The composition is useful as a chemically amplified, positive or negative tone, lithographic photoresist.

The Fluorinated Polymer

The fluorinated vinylic polymer preferably comprises monomeric units having the structure (I)

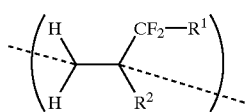
(I)

wherein $R^1$ is fluoro, methyl or trifluoromethyl, preferably fluoro, and $R^2$ is selected from the group consisting of

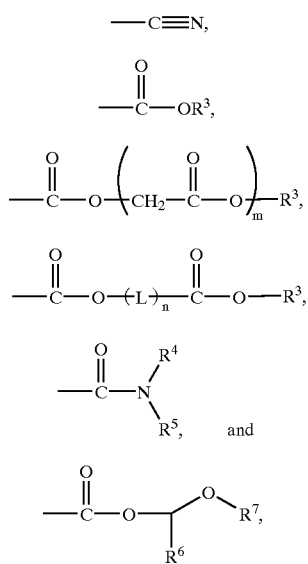

wherein $R^3$ is hydrogen, lower alkyl, or fluorinated lower alkyl (e.g., trifluoromethyl, pentafluoroethyl, 1,1,1,3,3,3-hexafluoroisopropyl), or is selected so as to render $R^2$ acid-cleavable. $R^4$ and $R^5$ are lower alkyl or are linked to form a five-or six-membered heterocyclic ring that may or may not contain an additional heteroatom, preferably N, O or S (in which case the ring may be, for example, piperidino, pyrrolidino, morpholino, piperazino, imidazolidino, etc.), $R^6$ and $R^7$ are lower alkyl or are linked to form a five-or six-membered heterocyclic ring that may or may not contain an additional heteroatom and/or a carbonyl moiety (e.g., tetrahydrofuranyl, tetrahydropyranyl, morpholino, dihydrofuran-2-one, etc.) m is an integer in the range of 1 to 8 inclusive, typically in the range of 1 to 4 inclusive, n is zero or 1, and L is a linking group such as an alkylene (typically lower alkylene) chain or a phenylene ring. For use in positive resist compositions, the polymer should contain $R^2$ substituents that are acid-cleavable and generate a free carboxylic acid moiety upon contact with photogenerated acid. The polymer may serve as either a base-soluble component of an unexposed resist or an acid-labile component of a resist, i.e., a component that releases acid following irradiation, by virtue of the photoacid generator in the resist composition and acid-cleavable pendant groups on the polymer, either in structure (I) or in a comonomer (e.g., the comonomer could be t-butyl methacrylate, or an alternative comonomer containing an acid-cleavable pendant group). Alternatively, or in addition, acid-cleavable pendant moieties may be present on a separate polymer that is admixed with the fluorinated polymer in the resist composition.

Suitable acid-cleavable functionalities include, but are not limited to, esters having the structural formula (III), (IV) and (V), amides having the structural formula (IV), and acetals and ketals having the structural formula (VII). In acid-cleavable ester groups, i.e., substituents (III), (IV) or (V), $R^3$ is preferably either tertiary alkyl, e.g., t-butyl, or a cyclic or alicyclic substituent (generally $C_7-C_{12}$) with a tertiary attachment point such as adamantyl, norbornyl, isobornyl, 2-methyl-2-adamantyl, 2-methyl-2-isobornyl, 2-methyl-2-tetracyclododecenyl, 2-methyl-2-dihydrodicyclopentadienyl-cyclohexyl or 1-methylcyclohexyl. Other examples of such acid-cleavable ester groups are set forth in U.S. Pat. No. 4,491,628 to Ito et al., entitled "Positive-and Negative-Working Resist Compositions with Acid-Generating Photoinitiator and Polymer with Acid Labile Groups Pendant from Polymer Backbone," and in the *Handbook of Microlithography, Micromachining, and Microfabrication, Vol.* 1: *Microlithography*, Ed. P. Raj-Coudhury, p. 321 (1997). Preferably, $R^2$ has the structure of formula (III), and $R^3$ is selected so as to render $R^2$ an acid-cleavable functionality, i.e., a molecular moiety that is cleavable with acid, particularly photogenerated acid. When $R^2$ is —(CO)—$OR^3$ (i.e., structure III), and $R^3$ is an acid-cleavable group, it will be appreciated that acid cleavage of the ester generates a free carboxylic acid group. Other suitable acid-cleavable protecting groups may be found in U.S. Pat. No. 5,679,495 to Yamachika et al. or in the pertinent literature and texts (e.g., Greene et al., Protective Groups in Organic Synthesis, $2^{nd}$ Ed. (New York: John Wiley & Sons, 1991)).

Preferred acid-cleavable pendant groups are organic ester groups having the structural formula (III), which undergo a cleavage reaction in the presence of photogenerated acid to generate a carboxylic acid group. Typically, the reaction of acid-cleavable functional groups with photogenerated acid occurs only, or is promoted greatly by, the application of heat to the film. Those skilled in the art will recognize the various factors that influence the rate and ultimate degree of cleavage of acid-cleavable functional groups as well as the issues surrounding integration of the cleavage step into a viable manufacturing process. The product of the cleavage reaction is a polymer-bound carboxylic acid group, which, when present in sufficient quantities along the polymer backbone, imparts solubility to the polymer in basic aqueous solutions.

If a linking group L is present (i.e., when j is 1), preferred L moieties are lower alkylene, fluorinated lower alkylene, lower alkyl-substituted lower alkylene, mono (trifluoromethyl)-substituted lower alkylene, or di(trifluoromethyl)-substituted lower alkylene. Specific L moieties include, but are not limited to, methylene, ethylene, trifluoromethylmethylene, di(trifluoromethyl)methylene, 1-trifluoromethylethylene, 2-trifluoromethylethylene, 1,1-di (trifluoromethyl)ethylene, 1,2-di(trifluoromethyl)ethylene, and 2,2-di(trifluoromethyl)ethylene.

The fluorinated polymer may be a homopolymer, in which case each monomer unit has the same structure, or it may be a copolymer comprising different monomer units each having the structure (I) or, more typically, a copolymer comprising a monomer unit having the structure (I) and one or more other monomer units, typically formed from addition polymerizable monomers, preferably vinyl monomers, for example to enhance the performance of the photoresist. Thus, the polymer may comprise minor amounts of acrylic acid or methacrylic acid monomer (e.g., 5–30%) to enhance development. The polymer may also comprise other suitable monomer units such as hydroxystyrene to enhance development and etch resistance or a silicon-containing monomer unit (e.g., a silicon-containing acrylate, methacrylate, or styrene) to enhance oxygen plasma etch resistance for bilayer applications. In general, suitable comonomers include, but are not limited to, the following ethylenically unsaturated polymerizable monomers: acrylic and methacrylic acid esters and amides, including alkyl acrylates, aryl acrylates, alkyl methacrylates and aryl methacrylates (for example, methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide); vinyl aromatics, including unsubstituted styrene and styrene substituted with one or two lower alkyl, halogen or hydroxyl groups (for example, styrene derivatives such as 4-vinyltoluene, 4-vinylphenol, α-methylstyrene, 2,5-dimethylstyrene, 4-t-butylstyrene and 2-chlorostyrene); butadiene; vinyl acetate; vinyl bromide; vinylidene chloride; and $C_5$–$C_{20}$, generally $C_7$–$C_{15}$, cyclic olefin monomers such as norbornene and tetracyclododecene; fluorinated analogs of any of the foregoing, e.g., fluorinated acrylic and methacrylic acid esters (e.g., fluorinated alkyl acrylates, fluorinated aryl acrylates, fluorinated alkyl methacrylates and fluorinated aryl methacrylates); and others readily apparent to one skilled in the art. For use in 157 nm lithography, fluorinated comonomers are preferred. When polymer (I) is a copolymer, it will generally comprise about 5–95 mole % structure (I) monomer units (or a combination of such monomer units) and about 5–95 mole % of other monomer units.

Monomer Synthesis and Polymerization

Fluorinated monomers useful for preparing polymers having the structure of formula (I) may be readily synthesized using methods described in the pertinent texts and literature, or as known to those of ordinary skill in the art. Methods for synthesizing representative monomers are described in the Examples.

One method for preparing the fluoropolymers useful in conjunction with the invention involves use of an anionic polymerization process as described, for example, by Ito et al. (1982) Macromolecules 15:915–920, and Ito et al. (1987), "Anionic Polymerization of α-(Trifluoromethyl) Acrylate," in *Recent Advances in Anionic Polymerization*, T. E. Hogen-Esch and J. Smid, Eds. (Elsevier Science Publishing Co., Inc.). Anionic polymerization is carried out as follows. First, the monomers are combined in a suitable solvent (e.g., tetrahydrofuran, toluene, n-hexane, diethyl ether, etc.) and introduced into a polymerization ampule by distillation in vacuo; a solution of a polymerization initiator is then introduced into the polymerization ampule, and the polymerization reaction proceeds until terminated, e.g., by addition of methanol. The resulting polymer is precipitated, isolated and dried. Suitable polymerization initiators are organic salts, inorganic salts and amines, and include, for example, potassium hydroxide (KOH), potassium cyanide (KCN), potassium carbonate ($K_2CO_3$), potassium benzoate ($KO_2CPh$), potassium t-butoxide (KO—t—Bu), sodium acetate ($NaO_2CCH_3$), sodium thiocyanate (NaSCN), tetraethylammonium bromide ($Et_4NBr$), pyridine, and triethylamine. Potassium t-butoxide is a particularly effective initiator for 157 nm resists. With metal-based initiators, a solubilizing agent such as a crown ether (e.g., 18-crown-6) is normally employed. The resulting fluorinated polymer typically has a number average molecular weight in the range of approximately 2,000 to 100,000, generally in the range of approximately 5,000 to 25,000, and preferably approximately 10,000.

The copolymers of the invention can also be prepared by radical copolymerization, using a suitable free radical initiator. The initiator may be any conventional free radical-generating polymerization initiator. Examples of suitable initiators include peroxides such as O-t-amyl-O-(2ethylhexyl)monoperoxycarbonate, dipropylperoxydicarbonate, and benzoyl peroxide (BPO) as well as azo compounds such as azobisisobutyronitrile (AIBN), 2,2'-azobis (2-amidino-propane)dihydrochloride, and 2,2'-azobis (isobutyramide)dihydrate. The initiator is generally present in the polymerization mixture in an amount of from about 0.2 to 20 mole % relative to the monomers. With radical polymerization, the resulting copolymer typically has a number average molecular weight in the range of approximately 500 to 50,000, generally in the range of approximately 1,000 to 15,000.

The Photoacid Generator

The second component of the resist composition is a photoacid generator ("PAG"). Upon exposure to radiation, the photoacid generator generates a strong acid. A variety of photoacid generators can be used in the composition of the present invention. The photosensitive acid generators used in the photoresist compositions of the invention may be any suitable photosensitive acid generator known in the photoresist art that is compatible with the other components of the photoresist composition. Examples of preferred photoresist acid generators (PAGs) include: α-(trifluoromethylsulfonyloxy)-bicyclo[2.2.1]hept-5-ene-2, 3-dicarboximide (MDT), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide (DDSN) may be used. Combinations of PAGs may be used. Generally, suitable acid generators have a high thermal stability (preferably to temperatures greater than 140° C.) so they are not degraded during pre-exposure processing. In addition to MDT and DDSN, suitable sulfonate compounds are sulfonate salts, but other suitable sulfonate PAGs include sulfonated esters and sulfonyloxy ketones. See U.S. Pat. No. 5,344,742 to Sinta et al., and *J. Photopolymer Science and Technology* 4:337–340 (1991), for disclosure of suitable sulfonate PAGs, including benzoin tosylate, t-butylphenyl α-(p-toluenesulfonyloxy)-acetate and t-butyl α-(p-toluenesulfonyloxy)-acetate. Onium salts are also generally preferred acid generators of compositions of the invention. Onium salts that contain weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts (e.g., triarylsulfonium and diaryliodonium hexafluoroantimonates, hexafluoroarsenates, and trifluoromethanesulfonates). Examples of preferred onium salts can be found in U.S. Pat. Nos. 4,442,197, 4,603,101, and 4,624,912. Other useful acid generators include the family of nitrobenzyl esters, and the s-triazine derivatives. Suitable s-triazine acid generators are disclosed, for example, in U.S. Pat. No. 4,189,323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl)iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, a,α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods of the invention will be known to those skilled in the art and/or are described in the pertinent literature.

The Resist Composition

The photoresist composition herein comprises both a fluorinated polymer as described in detail above, and an acid generator, with the polymer representing up to about 99 wt. % of the solids included in the composition, and the photoacid generator representing approximately 0.5–10 wt. % of the solids contained in the composition. Other components and additives may also be present.

For example, a positive photoresist composition may include a dissolution inhibitor, and a negative photoresist composition will include a crosslinking agent. If dissolution inhibitors and crosslinking agents are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, exhibit a moderating influence on $T_g$, strong etch resistance, and display good thermal stability (i.e., stability at temperatures of about 140° C. or greater). Suitable dissolution inhibitors include, but are not limited to, bisphenol A derivatives and carbonate derivatives, for example bisphenol A derivatives wherein one or both hydroxyl moieties are converted to a t-butoxy substituent or a derivative thereof such as a t-butoxycarbonyl or t-butoxycarbonylmethyl group; fluorinated bisphenol A derivatives such as $CF_3$-bisphenol A-OCH$_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydropyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with 1 to 3 $C_1$–$C_4$ fluoroalkyl carbonyloxy substituents, such as t-butyl trifluoroacetyllithocholate (see, e.g., U.S. Pat. No. 5,580,694 to Allen et al.).

The crosslinking agent used in the photoresist compositions of the invention may be any suitable crosslinking agent known in the negative photoresist art which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDER-LINK trademark from American Cyanamid Company. Other possible crosslinking agents include: 2,6-bis(hydroxymethyl)-p-cresol and compounds having the following structures:

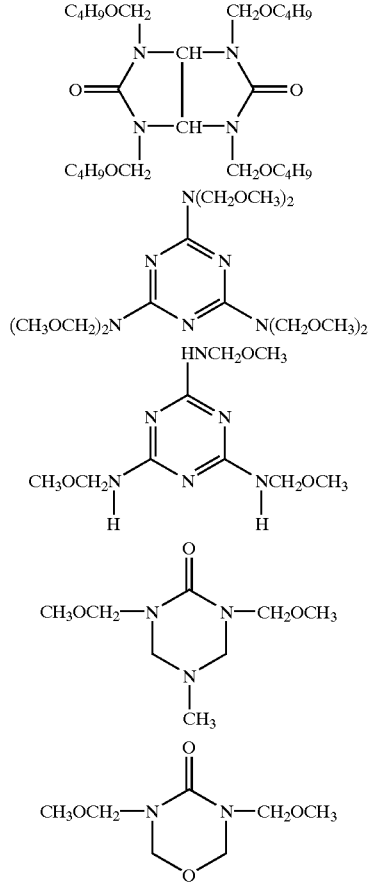

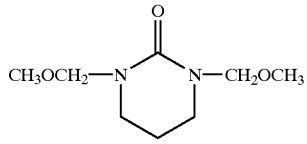

including their analogs and derivatives, such as those found in Japanese Laid-Open Patent Application (Kokai) No. 1-293339, as well as etherified amino resins, for example methylated or butylated melamine resins (N-methoxymethyl-or N-butoxymethyl-melamine respectively) or methylated/butylated glycolurils, for example as can be found in Canadian Patent No. 1 204 547. Combinations of crosslinking agents may be used.

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. In addition to the above components, the photoresist compositions of the invention generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. Examples of suitable casting solvents include: ethoxyethylpropionate (EEP), a combination of EEP and γ-butyrolactone (GBL), PGMEA, and ethyl lactate. The invention is not limited to selection of any particular solvent. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

Use in Generation of Resist Images on a Substrate

The present invention also relates to a process for generating a resist image on a substrate comprising the steps of: (a) coating a substrate with a film comprising the resist composition of the present invention; (b) imagewise exposing the film to radiation; and (c) developing the image. The first step involves coating the substrate with a film comprising the resist composition dissolved in a suitable solvent. Suitable substrates are ceramic, metallic or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer resist may be employed wherein a resist composition of the invention forms an upper resist layer (i.e., the imaging layer), and the underlayer is comprised of a material that is highly absorbing at the imaging wavelength and compatible with the imaging layer. Conventional underlayers include diazonapthoquinone ("DNQ")/novolak resist material.

Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90–150° C. for a short period of time, typically on the order of about 1 minute. The dried film has a thickness of about 0.02–5.0 microns, preferably about 0.05–2.5 microns, most preferably about 0.10 to 1.0 microns. In the second step of the process, the film is imagewise exposed to radiation. The radiation may be ultraviolet, electron beam or x-ray. Ultraviolet radiation is preferred, particularly deep ultraviolet radiation having a wavelength of less than about 250 nm, e.g., 157 nm using an $F_2$ excimer laser. The radiation is absorbed by the radiation-sensitive acid generator to generate free acid which with heating causes cleavage of the acid-cleavable pendant groups and formation of the corresponding acid. After the film has been exposed to radiation, the film may again be heated to an elevated temperature of about 90–150° C. for a short period of time, on the order of about 1 minute. It will be appreciated by those skilled in the art that the aforementioned description applies to a positive resist, and with a negative resist the exposed regions would typically be crosslinked by acid.

The third step involves development of the image with a suitable solvent. Suitable solvents include an aqueous base, preferably an aqueous base without metal ions such as the industry standard developer tetramethylammonium hydroxide or choline. Because the fluorinated polymer of the resist composition is substantially transparent at 157 nm, the resist composition is uniquely suitable for use at that wavelength. However, the resist may also be used with other ultraviolet wavelengths, e.g., 193 nm and 248 nm, or with electron beam or x-ray radiation.

The pattern from the resist structure may then be transferred to the material of the underlying substrate. Typically, the transfer is achieved by reactive ion etching or some other etching technique. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Accordingly, the processes for making these features involves, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the developed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. Nos. 4,855,017, 5,362,663, 5,429,710, 5,562,801, 5,618,751, 5,744,376, 5,801,094, and 5,821,469. Other examples of pattern transfer processes are described in Chapters 12 and 13 of Moreau, *Semiconductor Lithography, Principles, Practices, and Materials* (Plenum Press, 1988). It should be understood that the invention is not limited to any specific lithographic technique or device structure.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

Experimental

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures. Measurements: NMR spectra were recorded on Varian T-60 ($^1$H), Varian CFT-20 ($^1$H and $^{13}$C), IBM NR-80 ($^{19}$F) and Bruker AF250 ($^1$H and $^{13}$C) spectrometers. Gel permeation chromatography (GPC) was performed with a Waters Model 150 chromatograph equipped with six $\mu$-Styragel columns. Measurements were made at 30 and 40° C. in THF (PMTFMA and copolymers). Combustion analyses were performed by Childers Laboratories, Milford, N.J., and by Chemical Analytical Services, University of Calif., Berkeley, Calif.

EXAMPLE 1

Preparation of α-(Trifluoromethyl)acrylonitrile (TFMAN):

(a) 1,1,1-Trifluoroacetone cyanohydrin: To a stirred and cooled solution of 127.2 g (2.6 mol) sodium cyanide in 544 mL water was added dropwise 300 g (2.68 mol) of 1,1,1-trifluoroacetone. This solution was cooled to 4° C. and a cooled solution of 6N sulfuric acid (910 g) was added slowly with mechanical stirring keeping the temperature below 10° C. After stirring overnight at room temperature the reaction was extracted with diethyl ether, the extracts dried with sodium sulfate, filtered, and evaporated. The residue was distilled under reduced pressure (50 mm Hg) and the fractions boiling between 40–80° C. were collected and mixed with an equal volume of diethyl ether then stirred with sodium sulfate overnight. Filtration, evaporation, distillation, and sodium sulfate treatment of the residue was repeated twice to obtain 270 g (72%) of cyanohydrin (b.p.: 76–79° C./50 mm).

(b) 1,1,1-Trifluoroacetone cyanohydrin acetate: Triethylamine (194.3 g, 1.924 mol) was added dropwise to a stirred solution of 269 g (1.935 mol) of the cyanohydrin prepared in part (a), 202.7 g (1.987 mol) of acetic anhydride, 320 mL of methylene chloride, and 630 mg of 4-dimethylaminopyridine cooled to 4° C. After stirring overnight at room temperature the reaction was diluted with 200 mL water and extracted with methylene chloride. The methylene chloride extract was dried with sodium sulfate, filtered, concentrated, and distilled. The product acetate (321 g, 91%) was collected at 81–82° C./50 mm Hg.

(c) 2-(Trifluoromethyl)acrylonitrile: A total of 320 g (1.7 mol) of the cyanohydrin acetate prepared in part (b) was passed in a slow stream of nitrogen through a heated (500–550° C.) glass tube packed with glass tubing pieces. The pyrolysis product was collected via trap cooled in liquid nitrogen. The crude pyrolysis product was purified by fractional distillation to yield 139 g (65%) of pure 2-(trifluoromethyl)acrylonitrile. Fractions with purity greater than 99.5% (GC) were used for polymerization: bp 75–77° C. [lit. bp 75.9–76.2° C. (759 mm)]; $^1$H NMR (60 MHz, neat) δ 6.62 and 6.70 (CH$_2$); $^{13}$C NMR (20 MHz, CDCl$_3$) δ 112.2 (CN), 115.4 (αC) (J$_{CF}$ ≃40 Hz), 120.3 (CF$_3$) (J$_{CF}$=272.5 Hz), 138.4 (CH$_2$) (J$_{CF}$=3.8 Hz).

EXAMPLE 2

Preparation of 2-(Trifluoromethyl)acrylic acid (TFMAA):

(a) 3-Hydroxy-2-(trifluoromethyl)propionic acid: TFMAN (60 g, 0.496 mol) was added dropwise to 169 g of sulfuric acid (1.725 mol) which was stirred mechanically and heated to 120–130° C. After the addition was complete the mixture was stirred for an additional 30 minutes at 120–130° C. The mixture was allowed to cool slightly, 170 mL of water was added, and the reaction heated for 5 hours at 120° C. The cooled reaction mixture was extracted with several portions of diethyl ether, the ether extracts washed with brine, dried with sodium sulfate, filtered and, evaporated to yield 68.5 g (86%) of the hydroxy-acid as a colorless syrup.

(b) 2-(Trifluoromethyl)acrylic acid (TFMAA): Syrupy 3-hydroxy-2-(trifluoromethyl)propionic acid (73 g, 0.459 mol) was slowly added to 24 g of phosphorus pentoxide (0.085 mol) while avoiding excessive heat evolution. The mixture was cautiously heated to 160–200° C. while collecting the product with an air-cooled short path distillation apparatus as it disilled from the mixture. The solid product was redistilled, collecting pure product fractions (b.p. 157–160° C.) totaling 50.5 g (79%).

EXAMPLE 3

Preparation of Methyl α-(Trifluoromethyl)acrylate (MTFMA):

Methyl α-(Trifluoromethyl)acrylate was synthesized by a modification of the method described by Buxton (1954) J Chem. Soc., p. 366, as follows: Direct methanolysis of the cyanohydrin of 1,1,1-trifluoroacetone (prepared in Example 1, part (a)) gave methyl α-hydroxy-α-(trifluoromethyl) propionate in ca. 70% yield. The α-hydroxyl group was esterified by treating the propionate with acetic anhydride, triethylamine, and 4-(dimethylamino)pyridine in methylene chloride to give methyl α-acetoxy-α-(trifluoromethyl) propionate in ca. 75% yield. Pyrolysis of the ester acetate yielded MTFMA in ca. 62% yield. After ether extraction of the crude pyrolysis product, MTFMA was purified by fractional distillation and purity assayed by gas chromatography (GC). Fractions purer than 99.5% were used for all polymerizations: bp 104–105° C., lit. bp 103.8–105° C.; $^1$H NMR (60 MHz, CDCl$_3$) δ 3.80 (CH$_3$O), 6.40 and 6.67 (CH$_2$); $^{13}$C NMR (20 MHz, CDCl$_3$) δ 53.2 (CH$_3$O); 122.2 (CF$_3$) (J$_{CF}$=274 Hz), 133.2 (CH$_2$) (J$_{CF}$ ≃5 Hz), 133.2 (αC), (J$_{CF}$ ≃50 Hz), 162.7 (C=O).

EXAMPLE 4

Preparation of t-Butyl 2-(trifluoromethyl)acrylate (TBTFMA):

Oxalyl chloride (87.3 g, 0.68 mol) was added to a solution of TFMAA (15.0 g, 0.11 mol) in methylene chloride (90 mL) in a dropwise manner at room temperature under an nitrogen atmosphere. The solution was heated to reflux for 5 hours, and the solvent and excess reagent were removed on a rotary evaporator. The resulting acid chloride was added to a stirred solution consisting of t-butanol (44 g, 0.59 mmol) and pyridine (33.6 g, 0.42 mol) in dichloromethane at 0° C. over a 10 min period. After stirring overnight at room temperature, the solution was neutralized with diluted aqueous HCl and washed with saturated aqueous sodium bicarbonate. The organic phase was removed, and the aqueous phase was extracted with pentane. The combined organic solvents were reduced to a small volume by distillation and then the residue was chromatographed on a column of silica gel. The product was re-purified by distillation to give 14.0 g of TBTFMA as a colorless liquid (70%).

EXAMPLE 5

Anionic polymerization of MTFMA:

Anionic polymerizations of MTFMA were carried out in vacuo at room temperature under anhydrous conditions, and terminated by addition of methanol. Polymerization was conducted by mixing the MTFMA with the polymerization initiators listed in Table 1 and an equimolar amount of 18-crown-6 as a solubilizing agent for the metallic initiators. Polymerization time varied, as also indicated in the table. Polymers were purified by precipitation in methanol except for lower molecular weight materials, which were precipitated in hexanes, and dried in vacuo at about 40° C.

TABLE 1

Bulk Anionic Polymerization of MTFMA

| Initiator (mole %) | Time (hr) | Yield (%) | M$_n$ | M$_w$ |
|---|---|---|---|---|
| KOH (2.0) | 24 | 64 | 8,200 | 11,400 |
| KCN (2.0) | 24 | 82 | 11,600 | 21,300 |
| K$_2$CO$_3$.1½ H$_2$O (2.0) | 24 | 84 | 13,300 | 20,200 |
| KO$_2$CPh (2.0 | 24 | 70 | 11,700 | 16,200 |
| KO-t-Bu (2.0) | 15 | 76 | 20,300 | 41,600 |
| NaO$_2$CCH$_3$ (2.0) | 72 | 44 | 18,700 | 36,900 |
| NaSCN (2.0) | 113 | 43 | 14,700 | 21,600 |
| pyridine (dry) (2.0) | 4 | 70 | 60,300 | 109,900 |

The polymers were characterized using NMR and IR spectroscopy. Molecular weight determinations were made by gel permeation chromatography with a Waters Model 150 chromatograph equipped with six μ Styragel columns at 30° C. in THF and the reported values are polystyrene-equivalent. The optical density of the MTFMA polymer measured at 157 nm was 3.0/μm.

EXAMPLES 6–22

Free Radical Copolymerization of MTFMA and TFMAN with Methyl Methacrylate (MMA):

Radical copolymerizations of MMA and either MTFMA or TFMAN were carried out in bulk with 0.1 mol % benzoyl peroxide ("BPO") as an initiator at 60° C. (Tables 2 and 3). The copolymer formed was dissolved in chloroform, precipitated in methanol, isolated by filtration, and dried at 40–50° C. under vacuum. The composition of the copolymers was determined by elemental analysis and by $^1$H and $^{13}$C NMR. Results are set forth in tables 2 and 3.

TABLE 2

Radical Copolymerization of MTFMA and MMA

| Example No. | MTFMA/MMA feed (g) | mole fraction of MTFMA in feed | mole fraction of MTFMA in copolymer | copolymer yield, g (%) | time | molecular weight $M_n/M_w$ |
|---|---|---|---|---|---|---|
| 6 | 0.85/0.55 | 0.50 | 0.25 | 0.717 (51) | 5 days | 105,000/332,000 |
| 7 | 1.30/0.39 | 0.66 | 0.38 | 0.674 (40) | 4 days | 106,000/242,000 |
| 8 | 3.70/0.56 | 0.81 | 0.44 | 1.02 (24) | 3 days | 765,000/195,000 |

TABLE 3

Radical Copolymerization of TFMAN and MMA

| Example No. | mole fraction of TFMAN in feed | mole fraction of TFMAN in copolymer | copolymer yield, % | time | molecular weight $M_n/M_w$ |
|---|---|---|---|---|---|
| 15 | 0.18 | 0.22 | 6.7 | 2.2 hr | 219,000/520,000 |
| 16 | 0.30 | 0.23 | 7.7 | 3.0 hr | 254,000/408,000 |
| 17 | 0.39 | 0.28 | 6.6 | 3.5 hr | 223,000/340,000 |
| 18 | 0.50 | 0.31 | 7.4 | 4.3 hr | 203,000/290,000 |
| 19 | 0.60 | 0.33 | 5.6 | 4.8 hr | 153,000/255,000 |
| 20 | 0.70 | 0.41 | 4.7 | 5.0 hr | 127,000/216,000 |
| 21 | 0.80 | 0.65 | 3.5 | 7.0 hr | |
| 22 | 0.90 | 0.45 | 0.8 | 7.0 hr | |

We claim:

1. A chemical amplification photoresist composition comprising: (a) a fluorinated vinylic polymer consisting essentially of (i) fluorinated monomer units each having a pendant group that is a carboxylic acid, a nitrile, an amide, or an acid-cleavable functionality, and optionally (ii) second monomer units resulting from polymerization of an additional polymerizable, ethylenically unsaturated monomer; and (b) a radiation-sensitive acid generator, wherein the fluorinated vinylic polymer is substantially transparent to radiation having a wavelength of 157 nm.

2. A lithographic photoresist composition comprising: (a) a fluorinated vinylic polymer comprised of monomeric units having the structure of formula (I)

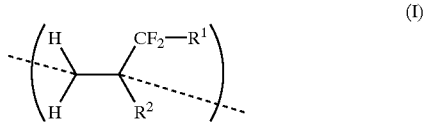

(I)

wherein $R^1$ is fluoro, methyl or trifluoromethyl, and $R^2$ is selected from the group consisting of

—C≡N, (II)

$$-\overset{O}{\underset{\|}{C}}-OR^3,$$ (III)

-continued $$-\overset{O}{\underset{\|}{C}}-O\overset{}{\underset{}{\left(CH_2-\overset{O}{\underset{\|}{C}}-O\right)_m}}R^3,$$ (IV)

$$-\overset{O}{\underset{\|}{C}}-O-(L)_n-\overset{O}{\underset{\|}{C}}-O-R^3,$$ (V)

$$-\overset{O}{\underset{\|}{C}}-N\overset{R^4}{\underset{R^5}{\diagdown}},\text{ and}$$ (VI)

$$-\overset{O}{\underset{\|}{C}}-O-\overset{}{\underset{R^6}{\overset{}{C}}}\overset{O}{\underset{}{\diagdown}}R^7,$$ (VII)

wherein $R^3$ is hydrogen, lower alkyl or fluorinated lower alkyl, or is selected so as to render $R^2$ acid-cleavable, $R^4$ and $R^5$ are lower alkyl or are linked to form a five-or six-membered heterocyclic ring that may or may not contain an additional heteroatom, $R^6$ and $R^7$ are lower alkyl or are linked to form a five-or six-membered heterocyclic ring that may or may not contain an additional heteroatom and/or a carbonyl moiety, m is an integer in the range of 1 to 3 inclusive, n is zero or 1, and L is a linking group.

3. The composition of claim 2, wherein $R^1$ is fluoro.

4. The composition of claim 3, wherein $R^2$ has the structure (II).

5. The composition of claim 3, wherein $R^2$ has the structure (III).

6. The composition of claim 5, wherein $R^3$ is H, so that $R^2$ is —COOH.

7. The composition of claim 5, wherein $R^3$ is lower alkyl.

8. The composition of claim 5, wherein $R^3$ is fluorinated lower alkyl.

9. The composition of claim 5, wherein $R^3$ is selected to render $R^2$ acid-cleavable.

10. The composition of claim 9, wherein $R^3$ is a tertiary alkyl substituent.

11. The composition of claim 10, wherein $R^3$ is t-butyl.

12. The composition of claim 10, wherein $R^3$ is a $C_6–C_{12}$ cyclic or alicyclic substituent with a tertiary attachment point.

13. The composition of claim 12, wherein $R^3$ is selected from the group consisting of adamantyl, norbornyl, isobornyl, 2-methyl-2-adamantyl, 2-methyl-2-isobornyl, 2-methyl-2-tetraclododecenyl and 1-methylcyclohexyl.

14. The composition of claim 3, wherein $R^2$ has the structure (IV).

15. The composition of claim 3, wherein $R^2$ has the structure (V).

16. The composition of claim 3, wherein $R^2$ has the structure (VI).

17. The composition of claim 3, wherein $R^2$ has the structure (VII).

18. The composition of claim 2, wherein the fluorinated vinylic polymer is a homopolymer.

19. The composition of claim 2, wherein the fluorinated vinylic polymer is comprised of two or more different monomer units having the structure of formula (I).

20. The composition of claim 2, wherein the fluorinated vinylic polymer is a copolymer comprising additional monomeric units not having the structure of formula (I).

21. The composition of claim 20, wherein the additional monomeric units result from polymerization of addition polymerizable, ethylenically unsaturated monomers.

22. The composition of claim 21, wherein the addition polymerizable, ethylenically unsaturated monomers are vinyl monomers.

23. The composition of claim 21, wherein the addition polymerizable, ethylenically unsaturated monomers are selected from the group consisting of: acrylic acid and methacrylic acid; acrylic and methacrylic acid esters and amides; fluorinated acrylic and methacrylic acid esters; unsubstituted styrene and styrene substituted with one or two lower alkyl, halogen or hydroxyl groups; butadiene; vinyl acetate; vinyl bromide; vinylidene chloride; and $C_5$–$C_{20}$ cyclic olefin monomers.

24. A lithographic photoresist composition comprising: (a) a fluorinated vinylic polymer; (b) a second polymer having a pendant group that is a carboxylic acid, a nitrile, an amide, or an acid-cleavable functionality; and (c) a radiation-sensitive acid generator.

25. A process for generating a resist image on a substrate, comprising the steps of:

(a) coating a substrate with a film of the chemical amplification photoresist composition of claim 1;

(b) exposing the film selectively to a predetermined pattern of radiation so as to form a latent, patterned image in the film; and (c) developing the latent image with a developer.

26. A process for generating a resist image on a substrate, comprising the steps of:

(a) coating a substrate with a film of a photoresist comprised of: (i) a fluorinated vinylic polymer having a fluorinated vinylic polymer comprised of monomeric units having the structure of formula (I)

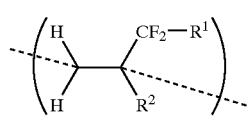
(I)

wherein $R^1$ is fluoro, methyl or trifluoromethyl, and $R^2$ is selected from the group consisting of

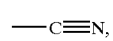
(II)

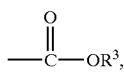
(III)

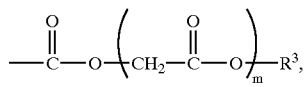
(IV)

-continued

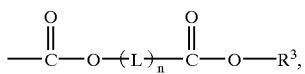
(V)

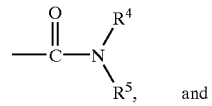
(VI)

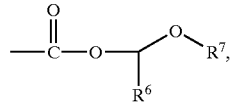
(VII)

wherein $R^3$ is hydrogen, lower alkyl or fluorinated lower alkyl, or is selected so as to render $R^2$ acid-cleavable, $R^4$ and $R^5$ are lower alkyl or are linked to form a five-or six-membered heterocyclic ring that may or may not contain an additional heteroatom, $R^6$ and $R^7$ are lower alkyl or are linked to form a five-or six-membered heterocyclic ring that may or may not contain an additional heteroatom and/or a carbonyl moiety, m is an integer in the range of 1 to 3 inclusive, n is zero or 1, and L is a linking group, and (ii) a radiation-sensitive acid generator;

(b) exposing the film selectively to a predetermined pattern of radiation so as to form a latent, patterned image in the film; and (c) developing the latent image with a developer.

27. The process of claim 26, wherein $R^1$ is fluoro.

28. The process of claim 27, wherein $R^2$ has the structure (II).

29. The process of claim 27, wherein $R^2$ has the structure (III).

30. The process of claim 29, wherein $R^3$ is H, so that $R^2$ is —COOH.

31. The process of claim 29, wherein $R^3$ is selected to render $R^2$ acid-cleavable.

32. The process of claim 31, wherein $R^3$ is a tertiary alkyl substituent.

33. The process of claim 31, wherein $R^3$ is a $C_6$–$C_{12}$ cyclic or alicyclic substituent with a tertiary attachment point.

34. The process of claim 26, wherein $R^2$ has the structure (IV).

35. The process of claim 26, wherein $R^2$ has the structure (V).

36. The process of claim 26, wherein $R^2$ has the structure (VI).

37. The process of claim 26, wherein $R^2$ has the structure (VII).

38. The process of claim 26, wherein the fluorinated vinylic polymer is a homopolymer.

39. The process of claim 26, wherein the fluorinated vinylic polymer is comprised of two or more different monomer units having the structure of formula (I).

40. The process of claim 26, wherein the fluorinated vinylic polymer is a copolymer comprising additional monomeric units not having the structure of formula (I).

41. The process of claim 26, wherein the radiation is electron beam, x-ray or ultraviolet radiation.

42. The process of claim 41, wherein the radiation is ultraviolet radiation.

43. The process of claim 42, wherein the ultraviolet radiation is deep ultraviolet radiation having a wavelength of less than 250 nm.

44. The process of claim 43, wherein the deep ultraviolet radiation has a wavelength of 157 nm.

45. A method of forming a patterned material structure on a substrate, said material being selected from the group consisting of semiconductors, ceramics and metals, said method comprising:
 (a) providing a substrate with a layer of said material;
 (b) applying a resist composition to the substrate to form a resist layer over said material layer, said resist composition comprising a fluorinated vinylic polymer comprised of monomeric units having the structure of formula (I)

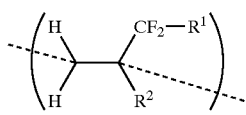

(I)

wherein $R^1$ is fluoro, methyl or trifluoromethyl, and $R^2$ is selected from the group consisting of

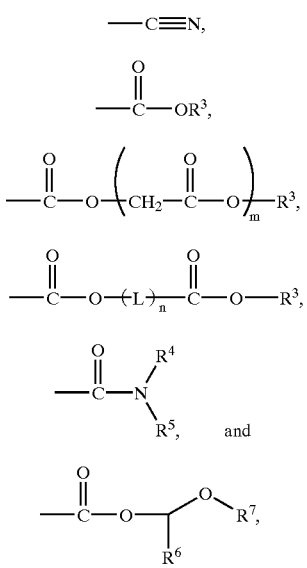

(II)

(III)

(IV)

(V)

(VI)

and (VII)

wherein $R^3$ is hydrogen, lower alkyl or fluorinated lower alkyl, or is selected so as to render $R^2$ acid-cleavable, $R^4$ and $R^5$ are lower alkyl or are linked to form a five-or six-membered heterocyclic ring that may or may not contain an additional heteroatom, $R^6$ and $R^7$ are lower alkyl or are linked to form a five-or six-membered heterocyclic ring that may or may not contain an additional heteroatom and/or a carbonyl moiety, m is an integer in the range of 1 to 3 inclusive, n is zero or 1, and L is a linking group, and (ii) a radiation-sensitive acid generator; having an acid-cleavable pendant group, and a radiation-sensitive acid generator;
 (c) patternwise exposing the substrate to radiation whereby acid is generated by the radiation-sensitive acid generator in exposed regions of the resist layer;
 (d) contacting the substrate with a developer solution to reveal a patterned resist structure; and
 (e) transferring the resist structure pattern to the material layer by etching into the material layer through spaces in said resist structure pattern.

46. The process of claim 45, wherein the radiation is electron beam, x-ray or ultraviolet radiation.

47. The process of claim 46, wherein the radiation is ultraviolet radiation.

48. The process of claim 47, wherein the ultraviolet radiation is deep ultraviolet radiation having a wavelength of less than 250 nm.

49. The process of claim 48, wherein the deep ultraviolet radiation has a wavelength of 157 nm.

50. The patterned substrate prepared by the process of claim 45.

51. A copolymer comprised of first monomeric units having the structure of formula (I)

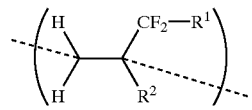

(I)

wherein $R^1$ is fluoro, methyl or trifluoromethyl, and $R^2$ is selected from the group consisting of

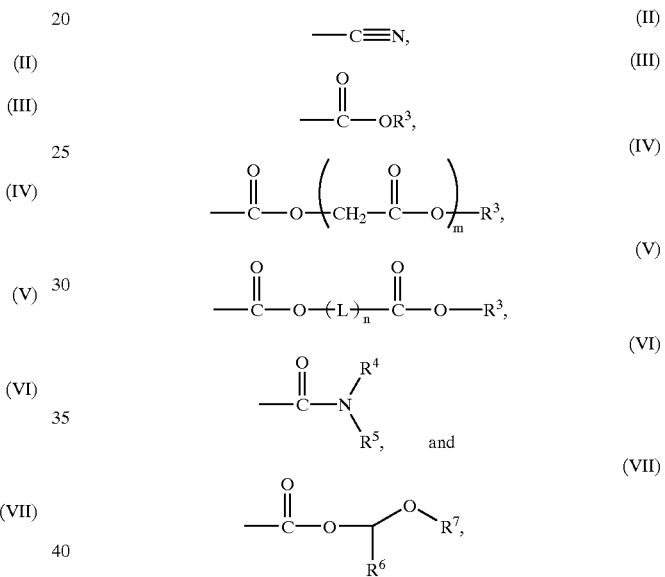

(II)

(III)

(IV)

(V)

(VI)

and (VII)

wherein $R^3$ is hydrogen, lower alkyl or fluorinated lower alkyl, or is selected so as to render $R^2$ acid-cleavable, $R^4$ and $R^5$ are lower alkyl or are linked to form a five-or six-membered heterocyclic ring that may or may not contain an additional heteroatom, $R^6$ and $R^7$ are lower alkyl or are linked to form a five-or six-membered heterocyclic ring that may or may not contain an additional heteroatom and/or a carbonyl moiety, m is an integer in the range of 1 to 3 inclusive, n is zero or 1, and L is a linking group, and second monomeric units formed by addition polymerization of an ethylenically unsaturated monomer.

52. The composition of claim 51, wherein the addition polymerizable, ethylenically unsaturated monomer is selected from the group consisting of: acrylic acid and methacrylic acid; acrylic and methacrylic acid esters and amides; fluorinated acrylic and methacrylic acid esters; unsubstituted styrene and styrene substituted with one or two lower alkyl, halogen or hydroxyl groups; butadiene; vinyl acetate; vinyl bromide; vinylidene chloride; and $C_5$–$C_{20}$ cyclic olefin monomers.

53. The copolymer of claim 52, wherein the ethylenically unsaturated monomer that provides the second monomeric unit is styrene or substituted styrene.

54. The copolymer of claim 53, wherein the ethylenically unsaturated monomer that provides the second monomeric unit is selected from the group consisting of styrene, 4-vinyltoluene, 4-vinyltoluene, 4-vinylphenol, αmethylstyrene, 2,5-dimethylstyrene, 4-t-butylstyrene and 2-chlorostyrene.

55. A chemical amplification photoresist composition comprising: (a) a fluorinated vinylic polymer comprised of a plurality of fluorinated monomer units each having a pendant group that is a nitrile, an amide, or an acid-cleavable functionality; and (b) a radiation-sensitive acid generator,
wherein a backbone carbon atom of each fluorinated monomer unit is directly substituted with a fluorinated alkyl group.

56. A chemical amplification photoresist composition comprising: (a) a fluorinated vinylic homopolymer in which each monomer unit is substituted with a pendant group that is a nitrile, an amide, or an acid-cleavable functionality; and (b) a radiation-sensitive acid generator.

57. A process for generating a resist image on a substrate, comprising the steps of:
(a) coating a substrate with a film of the chemical amplification photoresist composition of claim 55;
(b) exposing the film selectively to a predetermined pattern of radiation so as to form a latent, patterned image in the film; and
(c) developing the latent image with a developer.

58. A process for generating a resist image on a substrate, comprising the steps of:
(a) coating a substrate with a film of the chemical amplification photoresist composition of claim 56;
(b) exposing the film selectively to a predetermined pattern of radiation so as to form a latent, patterned image in the film; and
(c) developing the latent image with a developer.

59. The process of claim 57, wherein the fluorinated vinylic polymer is substantially transparent to radiation having a wavelength of 157 nm.

60. The process of claim 58, wherein the fluorinated vinylic polymer is substantially transparent to radiation having a wavelength of 157 nm.

* * * * *

UNITED STATES PATENT AND TRADEMARK OFFICE
CERTIFICATE OF CORRECTION

PATENT NO. : 6,730,452 B2
DATED : May 4, 2004
INVENTOR(S) : Brock et al.

It is certified that error appears in the above-identified patent and that said Letters Patent is hereby corrected as shown below:

Column 18,
Line 62, delete both instances of "isobomyl," and insert -- isobornyl, --.

Column 19,
Line 36, delete "claim 1" and insert -- claim 55 --.

Colunm 23,
Line 2, delete the second occurrence of "4-vinyltoluene,"
Line 18, delete the text of claim 57 in it's entirety, and replace with the following:
-- A process for generating a resist image on a substrate, comprising the steps of:
 (a) coating a substrate with a film of a photoresist comprised of: (i) a fluorinated vinylic polymer having a pendant group that is a carboxylic acid, a nitrile, an amide, or an acid-cleavable functionally; and (ii) a radiation-sensitive acid generator;
 (b) exposing the film selectively to a predetermined pattern of radiation so as to form a latent, patterned image on the film; and
 (c) developing the latent image with a developer. --

Signed and Sealed this

Third Day of August, 2004

JON W. DUDAS
*Acting Director of the United States Patent and Trademark Office*